US007532474B2

(12) United States Patent
Xue et al.

(10) Patent No.: US 7,532,474 B2
(45) Date of Patent: May 12, 2009

(54) APPARATUS FOR DISSIPATING HEAT FROM ELECTRONIC COMPONENTS IN AN ENCLOSED HOUSING

(75) Inventors: Bryce Xiaobo Xue, Acton, MA (US); Dale G. Robertson, Lowell, MA (US)

(73) Assignee: 3Com Corporation, Marlborough, MA (US)

( * ) Notice: Subject to any disclaimer, the term of this patent is extended or adjusted under 35 U.S.C. 154(b) by 0 days.

(21) Appl. No.: 11/358,384

(22) Filed: Feb. 21, 2006

(65) Prior Publication Data

US 2007/0195503 A1    Aug. 23, 2007

(51) Int. Cl.
*H05K 7/20*    (2006.01)
(52) U.S. Cl. .................. 361/704; 361/690; 361/719; 165/80.2; 165/185
(58) Field of Classification Search ............... 361/688, 361/704, 707, 714–715
See application file for complete search history.

(56) References Cited

U.S. PATENT DOCUMENTS

| | | | | | |
|---|---|---|---|---|---|
| 4,887,147 | A | * | 12/1989 | Friedman | 174/252 |
| 5,218,215 | A | * | 6/1993 | Liang et al. | 257/712 |
| 5,946,192 | A | * | 8/1999 | Ishigami et al. | 361/704 |
| 6,025,991 | A | * | 2/2000 | Saito | 361/704 |
| 6,058,013 | A | * | 5/2000 | Christopher et al. | 361/704 |
| 6,104,611 | A | * | 8/2000 | Glover et al. | 361/700 |
| 6,583,988 | B1 | * | 6/2003 | Lyons et al. | 361/719 |
| 6,722,776 | B1 | * | 4/2004 | Lyons et al. | 362/493 |
| 6,977,815 | B2 | * | 12/2005 | Hsu | 361/704 |
| 7,265,984 | B2 | * | 9/2007 | Numata | 361/719 |
| 7,307,844 | B2 | * | 12/2007 | Wu | 361/719 |
| 7,440,282 | B2 | * | 10/2008 | Brandenburg et al. | 361/704 |
| 2003/0210524 | A1 | * | 11/2003 | Berg et al. | 361/687 |
| 2006/0187643 | A1 | * | 8/2006 | Tsurufusa | 361/704 |

OTHER PUBLICATIONS

Chometics Technical Bulletin 45, CHO-THERM (R) 1671 Thermally Conductive Elastomer Insulators, Oct. 1999.*
Pictures of Western Electric 500 Rotary Dial Desk Phone, refurbished in Jun. 1973.*

* cited by examiner

Primary Examiner—Boris L Chervinsky
(74) Attorney, Agent, or Firm—Andrew J. Curtin

(57) ABSTRACT

An electronic device includes a housing configured to enclose an electronic component mounted to an inner portion of the housing. A thermally conductive gap-filler is in thermal contact with the electronic component. A heat sink is in thermal contact with the thermally conductive gap-filler and a thermally conductive plate is in thermal contact, at a first side, with the heat sink through an opening in the housing, and affixed, at the first side, to an outer portion of the housing surrounding the opening.

21 Claims, 3 Drawing Sheets

APPARATUS FOR DISSIPATING HEAT FROM ELECTRONIC COMPONENTS IN AN ENCLOSED HOUSING

FIELD OF THE INVENTION

The invention relates generally to heat dissipation for electronic components, and more particularly to providing a heat conduction channel for electronic components in enclosed housings.

BACKGROUND OF THE INVENTION

Thermal management is an important element of electronic device design. Both the performance reliability and life expectancy of electronic devices are inversely related to operating temperatures of components within the devices. For example, the relationship between reliability and the operating temperature of a typical silicon semi-conductor component shows that a reduction in the temperature of the electronic component corresponds to an exponential increase in the reliability and life expectancy of that component. Therefore, long life and reliable performance of an electronic device may be achieved by effectively controlling operating temperature within the limits set by component design engineers.

Heat sinks enhance heat dissipation from a hot surface, e.g., a heat generating electronic component, to a cooler ambient, e.g., room temperature air. In most cases involving electronic components, air is the coolant. Often, heat transfer across an interface between a component surface and the coolant air is not efficient within a system, and the interface represents a barrier for heat dissipation. A heat sink lessens the effect of the barrier by increasing the surface of the heat generating component that is in direct contact with the coolant. That allows more heat to be dissipated and lowers the electronic component operating temperature.

Prior art heat dissipation solutions often rely on a heat sink used in combination with a fan to provide air flow across the heat sink for thermal convection. If the electronic component is located within a housing, ventilation holes are provided through the housing to allow outside air to flow through the housing. However, ventilation holes allow dust and moisture to enter the housing from the outside and can coat electronic components within the housing, reducing the efficiency of heat transfer between the air and the electronic component and/or the heat sink. A ventilation fan accelerates that coating process.

Further, some electronic devices include audio components in or on the housing. For example, telephones including a hands-free option have a microphone mounted in the telephone base housing, apart from the microphone in the mouthpiece of the telephone hand set. Noise from a ventilation fan in the telephone base housing degrades the quality of the voice sounds acquired by the microphone.

Therefore, it is desired to enable heat dissipation from an electronic component in an enclosed housing that overcomes the problems of the prior art.

SUMMARY OF THE INVENTION

The invention provides an electronic device including a housing configured to enclose an electronic component mounted to an inner portion of the housing. A thermally conductive gap-filler is in thermal contact with the electronic component. A heat sink is in thermal contact with the thermally conductive gap-filler and a thermally conductive plate is in thermal contact, at a first side, with the heat sink through an opening in the housing, and affixed, at the first side, to an outer portion of the housing surrounding the opening.

DETAILED DESCRIPTION OF THE PREFERRED EMBODIMENT

Electronic Device Structure

Figure 1:
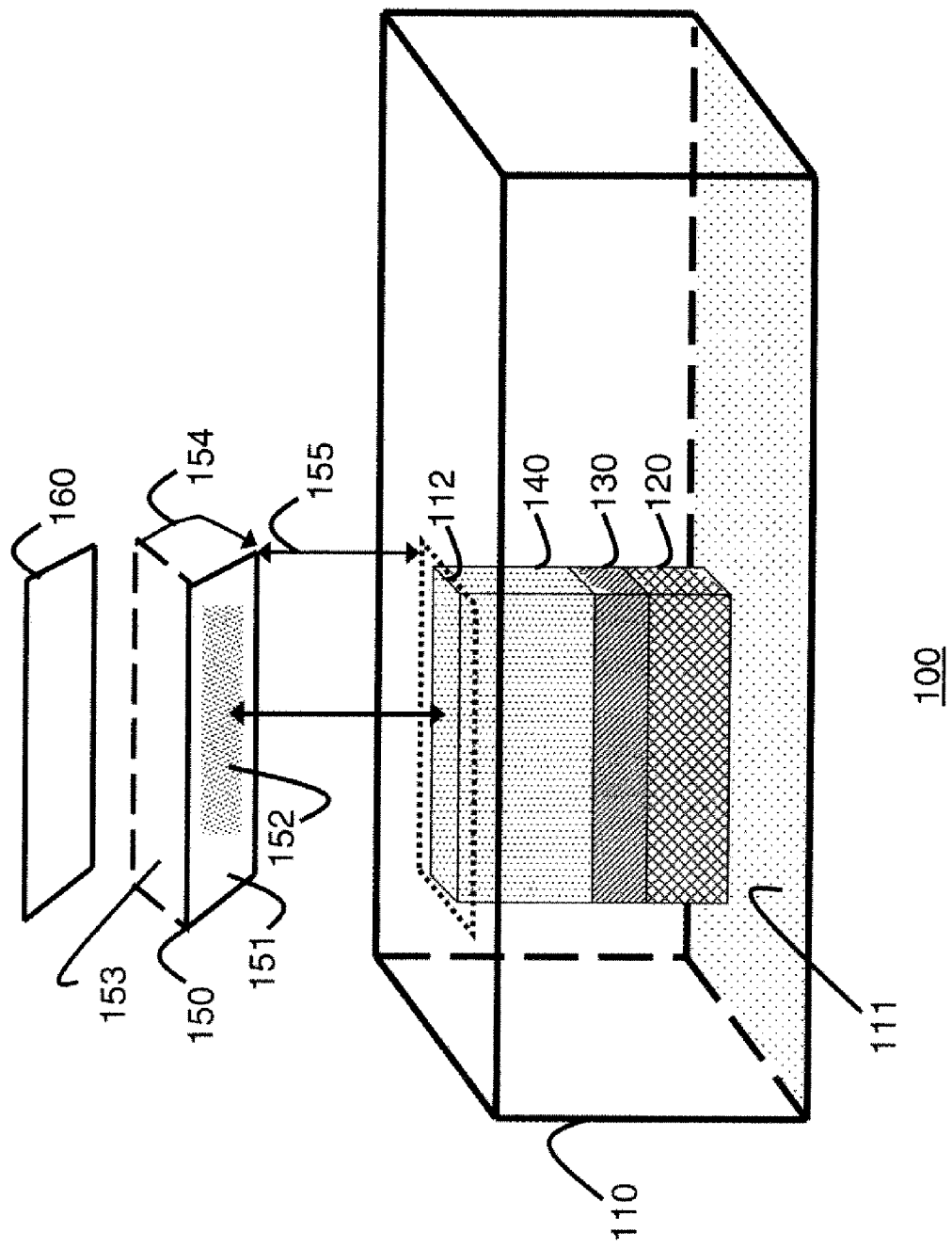
FIG. 1 is a block diagram of an electronic device according to the invention.

FIG. 1 shows an electronic device 100 according to our invention. The electronic device 100 includes a housing 110 enclosing and electronic component 120, a gap-filler 130, a heat sink 140, and a thermally conductive plate 150. Optionally, the electronic device 100 can include an insulating material 160.

Figure 3:
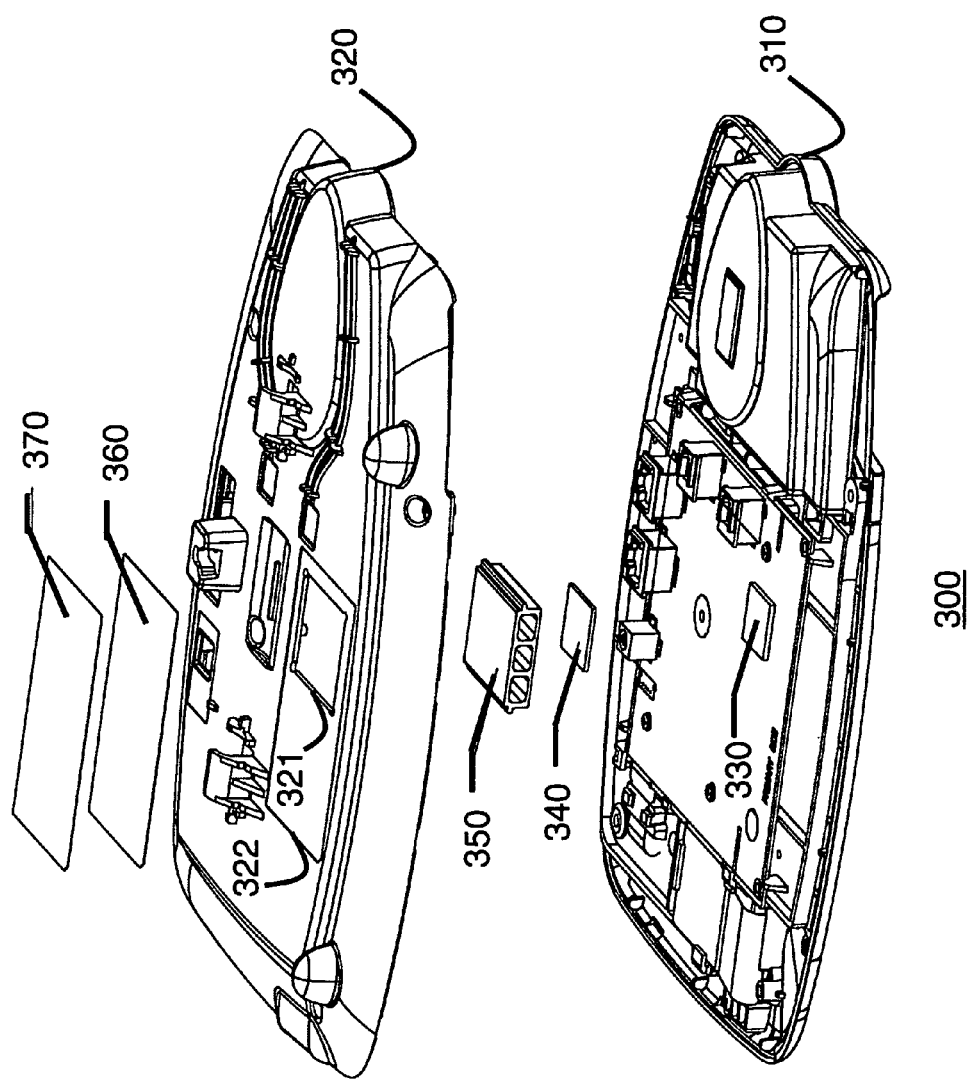
FIG. 3 is a detailed block diagram of the device in the embodiment of FIG. 2.

The electronic component 120 is mounted in an inner portion 111 of the housing 110. It should be understood that while the electronic component 120 is shown for illustrative purposes as mounted directly to a bottom side of the inner portion 111 of the housing in FIG. 1, the inner portion is anywhere within the enclosed housing. Therefore, the electronic component 120 can be mounted directly to any inner surface of the housing 110, or to another component enclosed within the housing, which is often the case with electronic components, e.g., processing chips mounted to a circuit board. An alternative embodiment 300 of the electronic device 100 is shown in FIG. 3, discussed below.

The gap-filler 130 is thermally conductive and is in thermal contact with the electronic component 120. It should be understood that surfaces that are in thermal contact can conduct heat across the contacting surfaces. A thermally conductive gap-filler is a thermal bridge for low thermal resistance between heat sources, such as electronic components, and other components, such as heat sinks. Preferably, the gap filler distorts upon receiving a compressive force to compensate for varying mechanical tolerances during a manufacturing process.

The heat sink 140 is in thermal contact with the thermally conductive gap-filler 130. The heat sink can be any type of known heat sink used for cooling electronic components. The compressive force can be used to provide or enhance the thermal contact between the electronic component and gap-filler, and between the gap filler and the heat sink.

Optionally, an adhesive may be used between the electronic component and the gap filler, and/or the gap filler and the heat sink. The use of an adhesive will facilitate some manufacturing processes used to make the invention.

The thermally conductive plate 150 is in thermal contact, at a first side 151, with the heat sink 140 through an opening 112 in the housing 110, and affixed, at the first side 151, to an outer portion of the housing surrounding the opening. For example, the stippled area 152 shown in the middle of the first side 151 can be in thermal contact with the heat sink 140, while the remainder of the first side 151 can be affixed to the outer portion of the housing surrounding the opening 112. The thermally conductive plate 150 preferably covers the entire opening 112.

A second side 153 of the thermally conductive plate 150 is capable of heat convection to air outside of the housing 110. The heat convection can occur by direct exposure of the plate 150 with the air, or through the optional insulating material 160 affixed to the second side 153 of the thermally conductive plate 150. It should be understood that FIG. 1 shows an articulated view of plate 150 for illustrative purposes only. Arrow 154 indicates a direction of de-articulation as first side 151 and second side 153 are preferable substantially opposite each other. Arrow 155 indicates a proper alignment of plate 150 to opening 112. The insulating material 160 can be a label used to identify the electronic device 100.

Gigabit Telephone

Ethernet is a local-area network (LAN) architecture that uses a bus or star topology and supports data transfer rates of 10 megabits per second (Mbps). Another, more recent version of Ethernet, called 100 Base-T or Fast Ethernet, supports data transfer rates of 100 Mbps. A most recent version, called Gigabit Ethernet, supports data rates of 1 gigabit (1,000 megabits) per second. The IEEE 802.3 standard specifies the physical and lower software layers for Ethernet architecture.

Gigabit Ethernet technology is becoming widely deployed in enterprise networks to support increased bandwidth requirements of converged voice, video and data communications.

With internet protocol (IP) telephone use also on the rise, gigabit Ethernet capability in telephones ensures that the faster gigabit speed is readily available to an end user. As networks migrate to Gigabit Ethernet, it is important for IP telephones to operate at the same gigabit speed.

Figure 2:
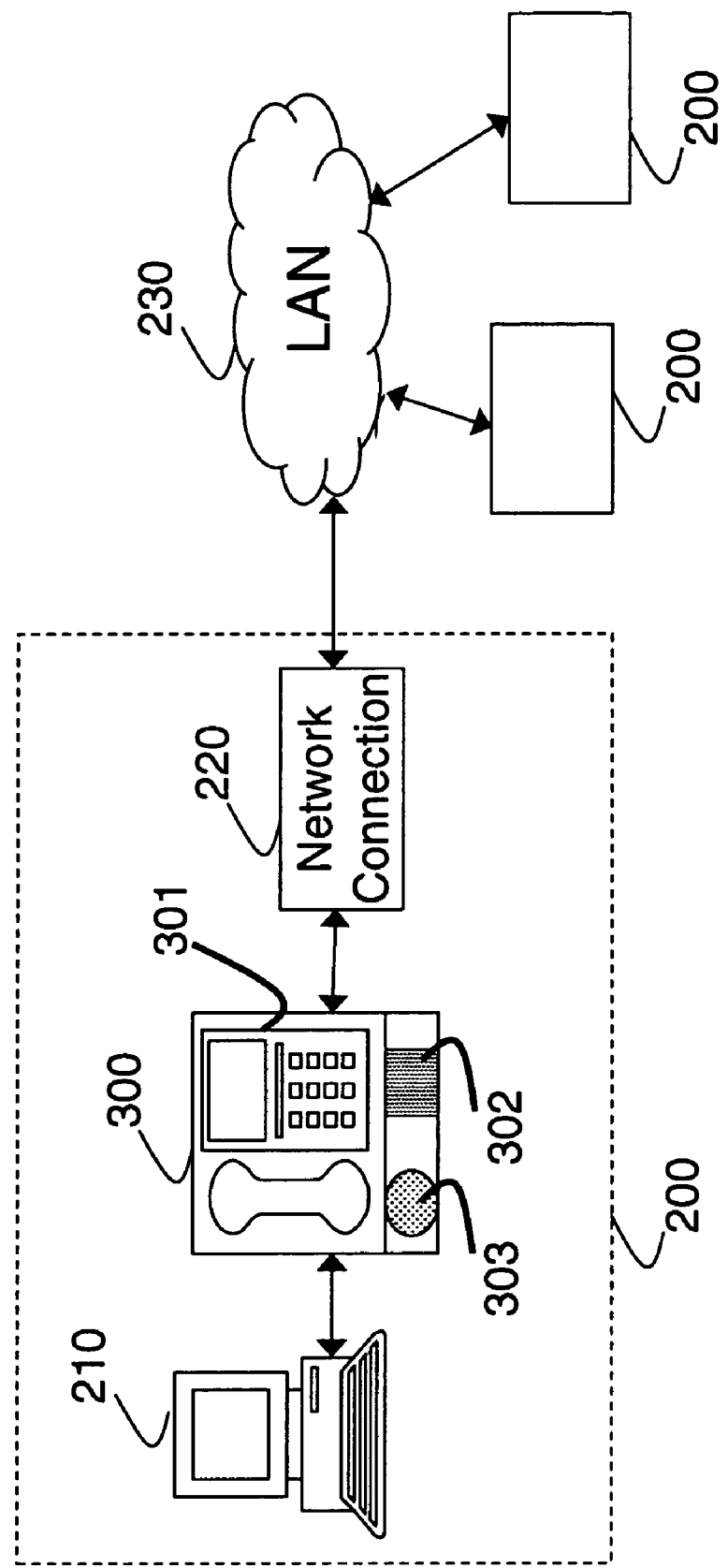
FIG. 2 is a block diagram of a system that includes an electronic device according to an embodiment of the invention.

FIG. 2 shows an exemplary network topology including offices 200 connected to an Ethernet LAN 230. The offices include devices 210 and 300 connected to the Ethernet LAN 230 via a network connection 220. The devices shown include a personal computer (PC) 210 connected to an IP telephone 300 according to the invention. The IP telephone has gigabit Ethernet capability and is connected to the network connection 220. Here, in addition to sending and receiving traffic to and from the LAN, the IP telephone passes traffic from the PC to the LAN and from the LAN to the PC. It should be understood that the topology 200 can include many other devices and types of device. The Ethernet capability of the IP telephone 300 is provided by an integrated Ethernet switch, not shown, which supports both voice calls through the telephone and data traffic to the PC using one Ethernet connection to each office 200, see, e.g., U.S. Pat. No. 6,212,195, owned by the assignee of the present application and incorporated herein by reference in its entirety. The IP telephone includes features such as a user interface 301 including an alpha-numeric keypad, a speaker 302 and microphone 303 for hands-free operation, where the IP telephone handset is not used.

In the network topology of FIG. 2, the integrated Ethernet switch in the IP telephone dictates the speed of the network. If the network is operating at Gigabit Ethernet (GbE) speeds, it is important for the phone to support the GbE rate to prevent a bottleneck between the local area network 230 and the PC 210.

Known integrated Ethernet switches having gigabit capability for IP telephones generate heat. Particularly, a physical layer transport medium (PHY) used by Ethernet switches generates heat. PHYs, of course, are not limited to use only with Ethernet switches, as is well known. It should be understood that the electronic component can be a combination of components, such as a switch and a PHY. If no means of heat dissipation is applied to the Ethernet switch in the IP telephone, the performance reliability and life expectancy of the switch, as well as any other components in the IP telephone, would be significantly degraded. Further, external components, such as an outer surface of the housing enclosing the Ethernet switch, or a user interface for the IP telephone, e.g. a key pad, could heat up enough to startle a user upon contact.

FIG. 3 shows the telephone base 300 according to an embodiment of the invention. In this embodiment, the housing, previously described with respect to FIG. 1, is a base of a telephone and includes a first housing part 310 and a second housing part 320 that can be coupled to enclose an electronic component. The first housing part is a top part of the base and the second housing part is a bottom part of the base. The base is communicably coupled to a handset (not shown), by wire or wirelessly, as is known in the art. Each of the first and second housing parts includes an inner portion and an outer portion. FIG. 3 shows the inner portion of the first housing part 310 and the outer portion of the second housing part 320. In a preferred embodiment, the first housing part 310 includes the user interface 301 on the outer portion (not shown). The second housing part includes an opening 321.

In this embodiment, the electronic component is an integrated Ethernet switch 330 mounted to the first housing part 310. The gap-filler is a thermally conductive elastomeric material 340 in thermal contact with the integrated Ethernet switch 330. The heat sink is a passive heat sink 350 in thermal contact with the thermally conductive elastomeric material 340. The thermally conductive plate is an aluminum plate 360 in thermal contact, at a first side, with the passive heat sink through the opening in the second housing part, and affixed, at the first side, to an outer portion of the second housing part surrounding the opening. The optional insulating material is a polyesther label 370 affixed to the aluminum plate 360.

Known thermally conductive elastomeric material 340 that can be used by the invention is made by coating a woven glass fiber web, dielectric film or aluminum foil substrate, with a silicone based emulsion that has been impregnated with thermally conductive particles, e.g. ceramic, Boron Nitride, Graphite, Alumina, or other known thermally conductive particles.

The thermally conductive elastomeric material 340 can use compressive force to achieve the thermal contact between the integrated Ethernet switch 330 and the elastomeric material 340. The compressive force can be applied by the passive heat sink 350 and the integrated Ethernet switch 330. When a compressive load is applied, the thermally conductive elastomeric material will fill surface irregularities of both the integrated Ethernet switch 330 and the passive heat sink 350. As pressure increases, the elastomeric material will fill microscopic voids between the integrated Ethernet switch and the heat sink, thereby decreasing thermal resistance in the invention.

Optionally, an adhesive may be used as described above with respect to FIG. 1.

The aluminum plate 360 is in thermal contact, at a first side, with the heat sink 350 through the opening 321 in the second housing part 320, and affixed, at the first side, to an outer portion of the second housing part surrounding the opening, as described above with respect to items 112, 140 and 150 of FIG. 1. The aluminum plate 360 preferably covers the entire opening 321. Optionally, the outer portion of the second housing part surrounding the opening can be a recessed outer portion 322 in order to provide a substantially planar outer surface of the second housing part 320 having the aluminum plate 360, and optionally, the polyesther label affixed thereto.

A second side of the aluminum plate 360 is capable of heat convection to air outside of the telephone base. The heat convection can be directly with the air, or through the optional insulating material 360.

It should be understood that the insulating material may reduce the efficiency of heat convection from the second side of the aluminum plate to the air, but also operates to insulate a user from the aluminum plate when it is hot. The insulating material therefore can serve at least two purposes. The first is to protect a user from heat emanating from the aluminum plate. The second is to identify the model number or other identifying information of the telephone.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. An electronic device, comprising:
    a housing configured to enclose an electronic component mounted to an inner portion of the housing;
    a thermally conductive gap-filler in thermal contact with the electronic component, wherein the gap-filler is a thermally conductive elastomeric material;
    a heat sink in thermal contact with the thermally conductive gap-filler; and
    a thermally conductive plate in thermal contact, at a first side, with the heat sink through an opening in the housing, and affixed, at the first side, to an outer portion of the housing surrounding the opening.

2. The electronic device of claim 1, further comprising:
    an insulating material affixed to a second side of the thermally conductive plate.

3. The electronic device of claim 1, wherein the electronic component is mounted directly to a bottom side of the inner portion of the housing.

4. The electronic device of claim 1, wherein the electronic component is mounted to another component enclosed within the housing.

5. The electronic device of claim 4, wherein the another component is a circuit board.

6. The electronic device of claim 1, wherein a compressive force provides the thermal contact between the electronic component and the gap-filler and between the gap filler and the heat sink.

7. The electronic device of claim 6, wherein the gap filler is capable of distorting upon receiving the compressive force.

8. The electronic device of claim 1, further comprising:
    an adhesive material between the electronic component and the gap filler.

9. The electronic device of claim 1 further comprising:
    an adhesive material between the gap filler and the heat sink.

10. The electronic device of claim 1, wherein the thermally conductive plate covers the entire opening.

11. The electronic device of claim 2, wherein the insulating material is a label for identifying the electronic device.

12. The electronic device of claim 1, wherein the electronic device is a telephone.

13. The electronic device of claim 11, wherein the electronic component is an integrated Ethernet switch capable of operating at Gigabit Ethernet (GbE) speeds.

14. The electronic device of claim 1, wherein the electronic component is a PHY.

15. The electronic device of claim 13, wherein the electronic component is a combination of a PHY and an integrated Ethernet switch.

16. The electronic device of claim 11, wherein the housing further comprises:
    a first housing part; and
    a second housing part configured to couple the first housing part to enclose the electronic component.

17. The electronic device of claim 16, wherein the first housing part is a top part of a base of a telephone and the second housing part is a bottom part of the base.

18. The electronic device of claim 16, wherein each of the first and second housing parts includes an inner portion and an outer portion, and further comprising:
    a user interface on the outer portion of the first housing part; and wherein the opening is in the second housing part.

19. The electronic device of claim 1, wherein the heat sink is a passive heat sink.

20. The electronic device of claim 1, wherein the thermally conductive plate is an aluminum plate.

21. The electronic device of claim 1, wherein the thermally conductive elastomeric material includes a woven glass fiber web, dielectric film or aluminum foil substrate coated with a silicone based emulsion that has been impregnated with thermally conductive particles.

* * * * *